(12) United States Patent
Sharma et al.

(10) Patent No.: US 9,767,901 B1
(45) Date of Patent: Sep. 19, 2017

(54) CIRCUITS HAVING SELECTOR DEVICES WITH DIFFERENT I-V RESPONSES

(71) Applicant: Hewlett Packard Enterprise Development LP, Houston, TX (US)

(72) Inventors: Amit S. Sharma, Palo Alto, CA (US); Gary Gibson, Palo Alto, CA (US); Naveen Muralimanohar, Santa Clara, CA (US); Martin Foltin, Fort Collins, CO (US); Greg Astfalk, Parker, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/245,607

(22) Filed: Aug. 24, 2016

(51) Int. Cl.
 *G11C 11/00* (2006.01)
 *G11C 13/00* (2006.01)

(52) U.S. Cl.
 CPC ........ *G11C 13/0069* (2013.01); *G11C 13/003* (2013.01); *G11C 13/0097* (2013.01)

(58) Field of Classification Search
 USPC ........................................ 365/148, 175, 163
 See application file for complete search history.

(56) References Cited

U.S. PATENT DOCUMENTS

| 9,425,237 | B2 | 8/2016 | Jo |
| 2009/0231910 | A1 | 9/2009 | Liu et al. |
| 2012/0104346 | A1 | 5/2012 | Yi et al. |
| 2012/0113706 | A1* | 5/2012 | Williams ........... G11C 13/0007 365/148 |
| 2013/0001494 | A1 | 1/2013 | Chen et al. |
| 2013/0021835 | A1 | 1/2013 | Hwang et al. |
| 2014/0003139 | A1 | 1/2014 | Pickett et al. |
| 2015/0029777 | A1* | 1/2015 | Chung ................... G11C 17/18 365/96 |
| 2015/0097187 | A1* | 4/2015 | Govoreanu ............. H01L 29/16 257/52 |
| 2015/0137060 | A1* | 5/2015 | Sun ..................... H01L 27/2409 257/4 |
| 2015/0348627 | A1* | 12/2015 | Taub ................... G11C 13/0004 365/163 |
| 2016/0315121 | A1* | 10/2016 | Sumino ............... H01L 27/2481 |

FOREIGN PATENT DOCUMENTS

WO  WO-2015116152  8/2015

* cited by examiner

*Primary Examiner* — Vu Le (74) *Attorney, Agent, or Firm* — Hewlett Packard Enterprise Patent Department (57) ABSTRACT

An integrated circuit is provided. In an example, the integrated circuit includes a first address line, a selector device electrically coupled to the first address lines, and a memory device electrically coupled between the selector device and a second address line. The selector device has a first I-V response in a first current direction and a second I-V response in a second current direction that is different from the first I-V response.

20 Claims, 7 Drawing Sheets

CIRCUITS HAVING SELECTOR DEVICES WITH DIFFERENT I-V RESPONSES

BACKGROUND

Many types of computing memory, including various types of Random Access Memory (RAM), are formed from arrays of individual memory devices. A small memory chip may include thousands or millions of individual memory-containing cells, while gigabit chips may include billions of cells. Because the cells are replicated many times, the physical size of an individual memory device and the spacing between cells may markedly impact how many memory devices can be included in a chip.

One type of memory structure that optimizes inter-cell spacing in some applications is the crossbar memory array. Some crossbar arrays include a set of parallel word lines and a set of parallel bit lines. The word lines may extend at right angles to the bit lines horizontally and be offset from the bit lines vertically. At each intersection, a memory device may extend vertically between the intersecting word line and the corresponding bit line. The memory device is electrically coupled to the intersecting word line and bit line, which allows the memory device to be uniquely addressed for reading and/or writing using the coupled lines.

However, while the word line and bit line may select a particular memory device, other current paths may exist between the word line and the bit line through other unselected memory devices. Sneak current through these other paths may contribute to efficiency losses, reduced performance, and reduced read/write accuracy in the memory chip.

BRIEF DESCRIPTION OF THE DRAWINGS

Certain examples are described in the following detailed description with reference to the drawings, of which.

DETAILED DESCRIPTION OF SPECIFIC EXAMPLES

A crossbar array provides a compact arrangement of independently-addressable cells such as memory devices. In an example, a set of parallel word lines extend in a first direction, while a set of parallel bit lines extend in a second direction perpendicular to the first. The word lines lay in a plane that is offset from a plane of the bit lines in a third direction perpendicular to the first and second directions. The cells may be disposed at each intersection of a word line and a bit line and connected to the intersecting lines so that each word line/bit line combination may select a unique cell.

However, because each word line and each bit line may be coupled to multiple cells, other electrical paths may exist in addition to the path through the selected cell. These additional paths may produce a sneak current through unselected cells that may impact device performance.

Resistive memory devices, such as memristors used in Resistive Random Access Memory (ReRAM), are affected by sneak current on both read and write operations. In that regard, a memristor may have more than one resistive state, and the resistive state of the device may be used to store data. However, when reading a selected memristor, sneak current through unselected memristors may affect the measurement of resistance for the selected device. Similarly, when writing a memristor, the unselected memristors may divert a write current used to change the selected device's resistive state. Increasing the write current may increase the size and power of the word and/or bit line drivers, leading to increased power consumption. Moreover, repeated exposure to sneak current may disturb the state of unselected devices.

To control this sneak current, each cell may include a selector device electrically in series with the remainder of the device to limit current through unselected cells. The selector device may exhibit a nonlinear I-V response with a relatively high resistance at lower voltages that are applied across an unselected cell and relatively lower resistance at higher voltages that are applied across a selected cell. This may reduce the sneak current through unselected cells while still allowing the selected cell to be accessed. However, the high and low bias resistances achievable by a given selector technology may be correlated, and increasing the resistance at lower voltages to reduce sneak current in an unselected device may increase the resistance at higher voltages causing a larger voltage drop across the selector device. This may affect read and write voltages for the cell.

The selector device may have a symmetric I-V response where the selector device's resistance is substantially the same for a given voltage magnitude regardless of the voltage polarity and current direction or it may have an asymmetric I-V response where the resistance is different based on the voltage polarity and current direction even if the voltage magnitude is the same. In some examples, this asymmetric behavior is leveraged to reduce sneak current while managing the increase in read and write voltages. For example, in an asymmetrical crossbar with word lines coupled to more cells than bit lines, the overall sneak current may be reduced by orienting an asymmetrical selector device so that the resistance is higher when the word line is being driven even if the result is a lower resistance when the bit line is being driven. The net effect may be a reduction in sneak current and a modest increase in read and write voltages. In this way, the asymmetry in the selector devices may be used to compensate for the asymmetry in the address lines.

Asymmetry in other aspects of the crossbar may be used to further balance sneak current against read voltage and write voltage. For example, memristors may have asymmetric write voltages, with a larger write voltage magnitude in a one current direction than the other. In these examples, the selector device and memristor may be electrically oriented so that the larger write voltage for the memristor corresponds to the smaller voltage drop across the selector device. As a result, the magnitudes of the write voltage thresholds for the cell as a whole may be made more symmetrical.

The asymmetries in the selector device, the memristor, and/or other components of the cell may be compensated for by using different bias voltages depending on the current direction. In that regard, unselected word lines and bit lines may be maintained at a bias voltage with a magnitude between the voltage of the selected word line and the voltage of the selected bit line. The bias voltage may reduce the voltage differential across the unselected cells and reduce the sneak current. In some examples, the magnitude of the bias voltage on the unselected address lines is different depending on the current direction so that the field applied to the selector device is substantially the same in either current direction. This may provide more consistent selector device behavior and allow the selector devices to more precisely control the sneak current.

By these mechanisms and others, the present disclosure provides a novel device and technique for reducing sneak current in an array of cells that improves the operating efficiency of the crossbar array. For example, selector devices with asymmetric I-V responses may be used to achieve proper sneak current control given asymmetry in the number of cells per word line versus the number of cells per a bit line. Accordingly, the amount of selector device asymmetry may be determined in part based on the difference in connected cell counts. In some examples, voltage asymmetry in other elements such as a memory device are used to offset the asymmetry in the selector devices. As a result, read or write voltages for the cell as a whole may be made more symmetrical. In some examples, different bias voltages are used for different voltage polarities and current directions in order to normalize the selector device behavior.

These and other examples are described with reference to the following figures. Unless noted otherwise, these figures and their accompanying description are non-limiting and no element is characteristic of any particular example. In that regard, features from one example may be freely incorporated into other examples without departing from the spirit and scope of the disclosure. Terms such as "horizontal", "vertical", "above", "below", "on top of", "beside", etc. are used in the interest of clarity and do not indicate a specific position and/or orientation. Rather, the terms are used to distinguish relative position and/or orientation.

Figure 1:
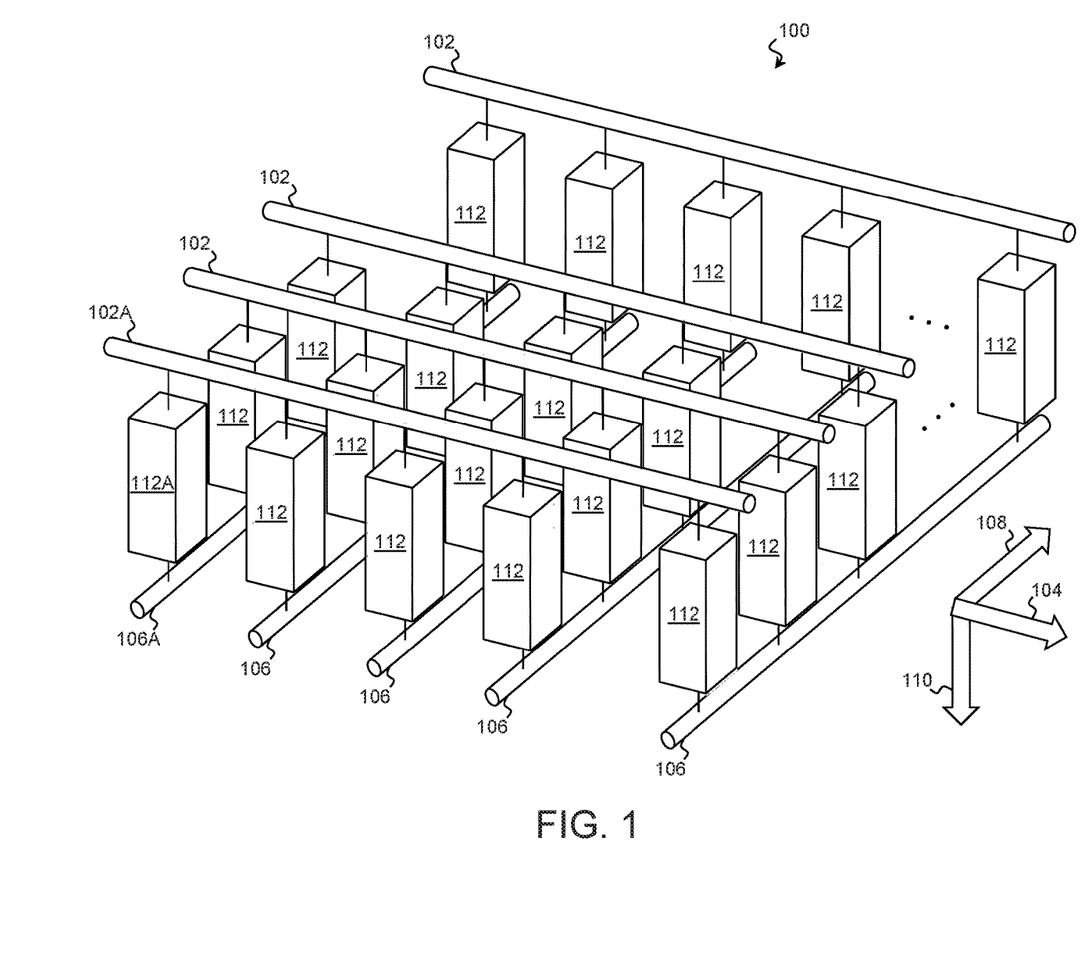
FIG. 1 is a perspective diagram of a crossbar circuit according to some examples of the present disclosure.
Figure 2:
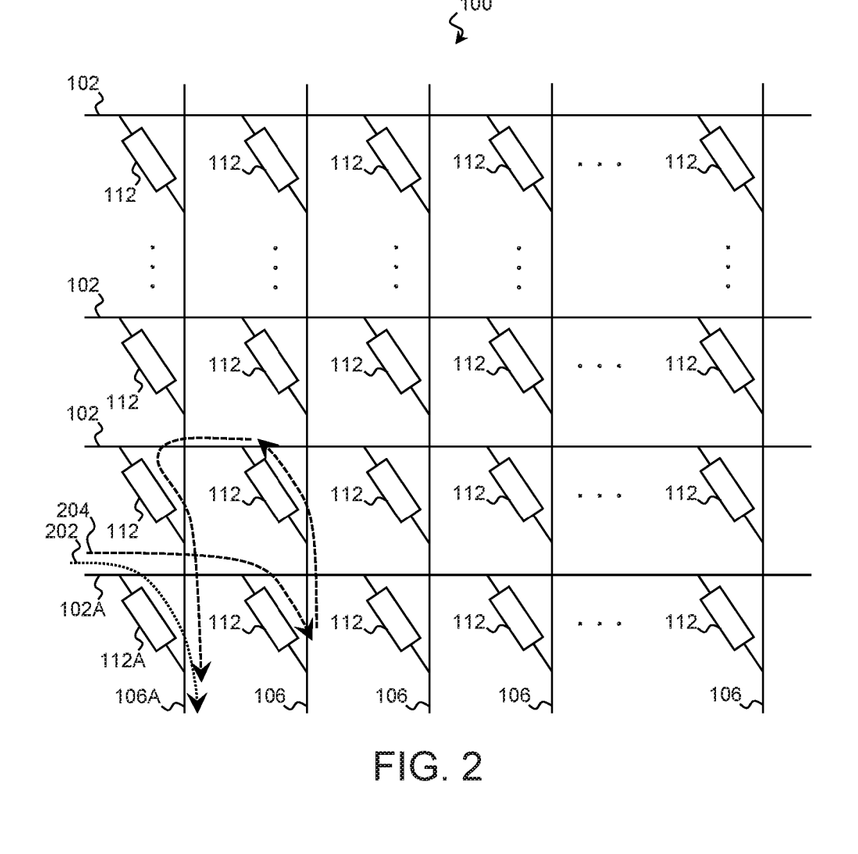
FIG. 2 is a circuit diagram of a crossbar circuit according to some examples of the present disclosure.

FIG. 1 is a perspective diagram of a crossbar circuit 100 according to some examples of the present disclosure. FIG. 2 is a circuit diagram of the crossbar circuit 100 according to some examples of the present disclosure. The crossbar circuit 100 includes a first set of address lines 102 of a first type. The first set of address lines 102 may represent word lines, bit lines, or any other suitable type of address line. In the illustrated examples, the first set of address lines 102 extend horizontally in a first direction 104 and are substantially parallel to one another. The crossbar circuit 100 also includes a second set of address lines 106 of a second type that is complementary to the first type. For example, if the first set of address lines 102 are word lines, the second set of address lines 106 may be bit lines and vice-versa. The second set of address lines 106 may extend horizontally in a second direction 108 substantially perpendicular to the first and are substantially parallel to one another. The second set of address lines 106 may be offset from the first set of address lines 102 in a vertical direction 110.

Cells 112 may extend in the vertical direction 110 between the first set of address lines 102 and the second set of address lines 106 and are electrically coupled to one line of the first set of address lines 102 and one line of the second set of address lines 106. In particular, each cell 112 may be electrically coupled between a unique combination of one line of the first set of address lines 102 and one line of the second set of address lines 106 so that each cell 112 is uniquely addressable via the coupled lines. For example, cell 112A is electrically coupled to line 102A of the first set of address lines 102 and to line 106A of the second set of address lines 106 and is uniquely addressable using lines 102A and 106A. In this way, the lines of the first set of address lines 102 and the second set of address lines 106 may be electrically coupled to a plurality of cells 112, yet each cell 112 remains independently addressable.

The lines may be coupled to any number of cells 112, and in some examples, the lines of the first set of address lines 102 are coupled to a different number of cells 112 than the lines of the second set of address lines 106. In one such example, the lines of the first set of address lines 102 are word lines and are coupled to ten times as many cells 112 as the lines of the second set of address lines 106, which are bit lines.

Each cell 112 may represent any number and combination of suitable cells such as memory devices, bipolar devices, other active devices, diodes, resistors, inductors, capacitors, other passive devices, etc. In some examples, the cells 112 include a memory device with a memristive device or other memory device. In these examples and others, an individual cell 112 may be selected and addressed using the line of the first set of address lines 102 and the line of the second set of address lines 106 to which the cell 112 is electrically coupled.

Selecting a cell 112 may include applying a voltage across the lines to which it is coupled, resulting in a current path between the coupled lines. Referring to FIG. 2, cell 112A provides a current path 202 between line 102A and line 106A. However, because the crossbar circuit 100 may not electrically isolate each cell 112, additional current paths may exist between the active lines. As merely one example, current path 204 also exists between line 102A and line 106A. These additional paths and the associated sneak currents may detrimentally affect sensing or writing circuitry when selecting and operating on a cell 112.

Figure 3:
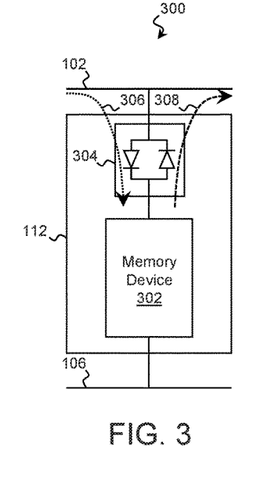
FIG. 3 is a circuit diagram of a crossbar circuit portion including a selector device according to some examples of the present disclosure.
Figure 4:
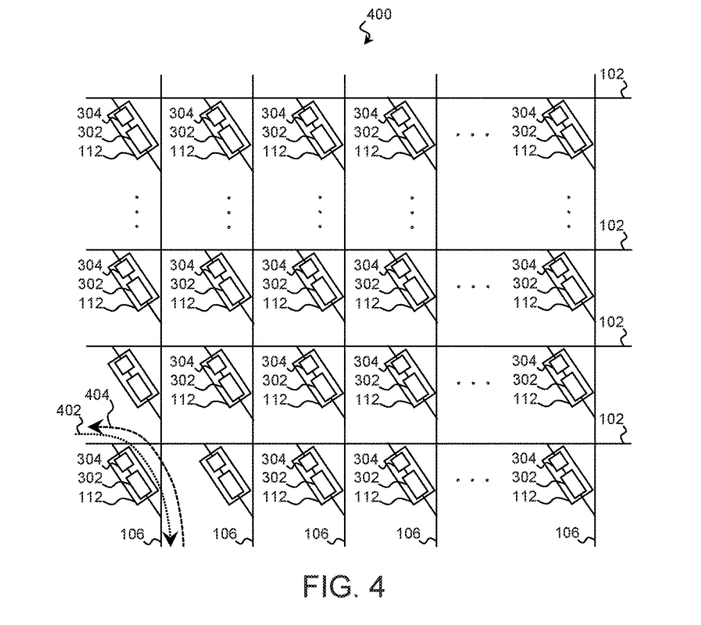
FIG. 4 is a circuit diagram of a crossbar circuit according to some examples of the present disclosure.
Figure 5:
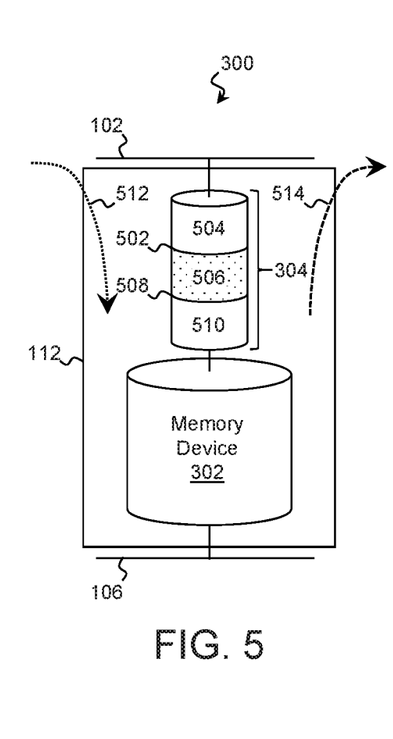
FIG. 5 is a diagram of a crossbar circuit portion including a selector device according to some examples of the present disclosure.

To limit the sneak current through unselected cells 112, each cell 112 may include a selector device to control the flow of current through unselected cells 112 as shown in FIGS. 3 and 4. In that regard, FIG. 3 is a circuit diagram of a crossbar circuit portion 300 including a selector device according to some examples of the present disclosure. FIG. 4 is a circuit diagram of a crossbar circuit 400 according to some examples of the present disclosure. The crossbar circuit 400 includes the crossbar circuit portion 300 of FIG. 3. FIG. 5 is a diagram of the crossbar circuit portion 300 including the selector device according to some examples of the present disclosure.

Referring first to FIG. 3, the crossbar circuit portion 300 includes a cell 112 extending between and electrically coupled to an address line 102 of a first type (e.g., a word line or a bit line) and an address line 106 of a second, complementary type (e.g., a bit line or a word line), each substantially similar to those of FIGS. 1 and 2. Accordingly, the cell 112 may include any number and combination of suitable cells such as memory devices, transistors, bipolar devices, other active devices, diodes, resistors, inductors, capacitors, and/or other passive devices. In some examples, the cell includes a memory device 302 such as a Resistive Random-Access Memory (ReRAM) cell, a flash memory device, a DRAM cell, an SRAM cell, and/or other suitable cell.

To reduce the sneak current through the memory device 302 when it is unselected, the cell 112 may include a selector device 304 electrically in series with the memory device 302. The selector device 304 may exhibit a nonlinear I-V (current and voltage) response with a relatively high resistance to inhibit sneak current when the cell 112 experiences a relatively low voltage characteristic of being unselected and a relatively low resistance to allow current to flow when the cell 112 experiences a relatively high voltage characteristic of being the selected cell 112. In some examples, where the asymmetry in I-V characteristics is realized using electrode-controlled conduction, the device 304 may be represented schematically as a pair of parallel diodes.

The selector device 304 may have a different I-V response depending on the polarity of the voltage applied and the current direction. In other words, the selector device resistances (at the selected voltage, the unselected voltage, or both) associated with current direction 306 may be higher or lower than the corresponding resistances associated with current direction 308. This electrical asymmetry may be used to reduce sneak current when the cell 112 is incorporated into a larger structure such as a crossbar.

Examples of this are described with reference to FIG. 4. Referring to FIG. 4, the cell 112 may be incorporated into a crossbar circuit 400 substantially similar to that of FIGS. 1 and 2 in many regards. The crossbar circuit 400 includes a plurality of cells 112 containing selector devices 304 and memory devices 302 electrically coupled between a first set of address lines 102 and a second set of address lines 106 each substantially as described above. As can be seen, the lines of the first set of address lines 102 may couple to a different number of cells 112 than the lines of the second set of address lines 106. In general, an address line coupled to more cells 112 will produce a larger sneak current than an address line coupled to fewer cells 112 because of the electrical effects of resistances in parallel. As a result, read or write current produced by driving an address line with more coupled cells 112 may produce a larger sneak current than that produced by driving an address line with fewer coupled cells 112.

Accordingly, in some such examples, a sneak current associated with driving an address line 102 (represented by current direction 402) is larger than a sneak current associated with driving an address line 106 (represented by current direction 404). To reduce the larger sneak current, the resistance of the selector device 304 in the orientation that corresponds to the current direction 402 is configured to be relatively larger. To mitigate the impact on the read and write voltages of the cell 112, the resistance of the selector device 304 in the orientation that corresponds to the current direction 404 is configured to be relatively smaller. The overall sneak current may be reduced even though the resistance when driving address line 106 is not as high.

Referring next to FIG. 5, in some examples, the nonlinear I-V responses are produced, in part, by conductor/insulator or conductor/semiconductor interfaces of the selector device 304. The illustrated selector device 304 includes two such interfaces. Each interface may be primarily associated with a particular current direction. Interface 502 is between a first selector electrode 504 and an intermediate portion 506 (such as a semiconductor or insulating material) of the selector, and interface 508 is between a second selector electrode 510 and the intermediate portion 506. Interface 502 may be associated with and predominantly affect the resistance in current direction 514 (because current direction is opposite the flow of electrons), while interface 508 may be associated with and predominantly affect the resistance in current direction 512, when the electrical conduction is dominated by electrons.

The electrical responses of the interfaces 502 and 508 may be due, in part, to a Schottky effect. The first interface 502 between the first selector electrode 504 and the intermediate portion 506 and the second interface 508 between the intermediate portion 506 and the second selector electrode 510 may each define a separate and independent Schottky barrier with a nonlinear I-V response. Accordingly, the current density through the interfaces may be modeled using the Schottky equation:

$$J_O = AT^2 e^{-\phi_S/kT}$$

where $J_O$ is the current density, A is the Richardson constant ($1.20173 \times 10^6$ A/m$^2$K$^2$), T is the temperature, $\phi_S$ is the Schottky barrier height of the interface, and k is the Boltzman constant. By selecting compositions and configurations of the first selector electrode 504, the second selector electrode 510, and the intermediate portion 506, particular Schottky barrier heights ($\phi_S$) for interface 502 and interface 508 may be selected. This in turn governs the I-V response of the selector device 304 in the respective current directions.

In various examples, the first selector electrode 504 and the second selector electrode 510 may each include one or more layers of a conductive material such as titanium, tantalum, tungsten, ruthenium, platinum, other metals and alloys thereof, metal oxides, metal nitrides, metal carbides, and/or other conductive materials. The intermediate portion 506 may include any suitable material such as a semiconductor (e.g., a crystalline, polycrystalline, or amorphous semiconductor), a dielectric (e.g., a semiconductor oxide, semiconductor nitride, a semiconductor carbide, etc.), an insulator, a metal-silicon compound, and/or other suitable materials.

The first selector electrode 504 and second selector electrode 510 may be configured so that the respective interfaces have a symmetric I-V response where the selector device's resistance is substantially the same for a given voltage magnitude regardless of the voltage polarity and current direction. This may be accomplished by configuring the electrodes so that interfaces 502 and 512 have substantially the same Schottky barrier heights.

Alternatively, the first selector electrode 504 and the second selector electrode 510 may be configured so that the selector device 304 has an asymmetric I-V response where the resistance is different for a give magnitude depending on voltage polarity. This asymmetric behavior may be used to achieve a reduction in sneak current given asymmetry in the number of cells per address line 102 versus the number per address line 106. For example, a sneak current associated driving any of the first set of address lines 102 (e.g., current direction 512) may be larger than a sneak current associated with driving any of the second set of address lines 106 (e.g., current direction 514) due to differences in the number of cells 112 coupled to the address lines or other causes. To reduce the larger sneak current, the selector device 304 may have a greater resistance when any of the first set of address lines 102 is driven than when any of the second set of address lines 106 is driven.

The greater resistance may be achieved by configuring the Schottky barrier height of interface 508, which corresponds to current direction 512, to be relatively larger. To mitigate the impact on the read and write voltages of the cell 112, the Schottky barrier height of interface 502, which corresponds to current direction 514, may be configured to be relatively smaller. In other words, the Schottky barrier height of interface 508 is selected to be larger than the Schottky barrier height of interface 502 based on the sneak current associated with current direction 512 being larger than the sneak current associated with current direction 514. The difference in the Schottky barrier height of interface 508 and the Schottky barrier height of interface 502 may be proportional to the asymmetry in the number of cells 112 coupled to lines 102 and 106 that the different barrier heights are compensating for.

In an example, the second selector electrode 510 includes ruthenium and/or platinum, and the intermediate portion 506 includes silicon to produce an interface 508 with a relatively high Schottky barrier height because the sneak current associated with current direction 512 is relatively high. In general, the Schottky barrier height of an interface depends on the relative work functions of the materials, and an electrode with a higher work function tends to result in a higher Schottky barrier height. In contrast, the first selector electrode 504 may include titanium nitride and/or tantalum nitride to produce an interface 502 with a relatively low Schottky barrier height because the sneak current associated with current 514 is relatively low. In this way, the selector device 304 decreases the sneak current in the orientation with the greater sneak current while providing reduced resistance in the orientation with the lesser sneak current.

Figure 6:
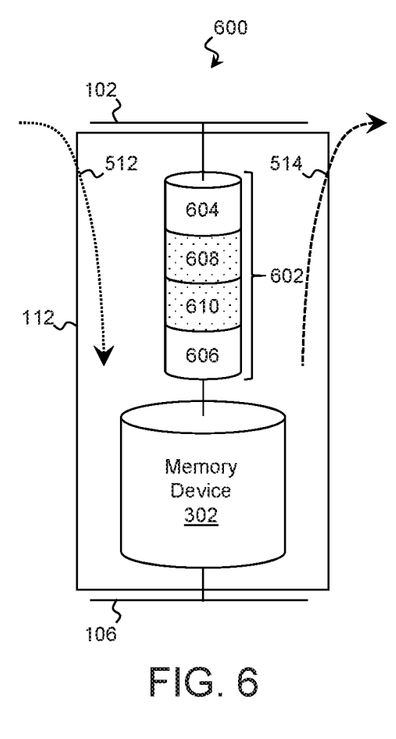
FIG. 6 is a diagram of a crossbar circuit portion including a tunneling selector device according to some examples of the present disclosure.

In some examples, tunneling (by electrons or holes) creates the asymmetric I-V response of the selector device. FIG. 6 is a diagram of a crossbar circuit portion 600 including a tunneling selector device 602 according to some examples of the present disclosure. The crossbar circuit portion 600 includes a cell 112 electrically coupled to an address line 102 of a first type (e.g., a word line or a bit line) and an address line 106 of a second, complementary type (e.g., a bit line or a word line), each substantially similar to those above.

The cell 112 includes a tunneling selector device 602 electrically in series with a memory device 302. The tunneling selector device 602 may include a pair of electrodes (e.g., electrode 604 and electrode 606) that may each include any suitable conductor including a metal, a metal alloy, a metal oxide, a metal nitride, a metal carbide, and/or other conductive materials. In the illustrated examples, the electrodes 604 and 606 are electrically separated by two intermediate layers (e.g., layer 608 and layer 610). The intermediate layers 608 and 610 may each include any suitable semiconductor, dielectric, and/or insulating material such as a crystalline, polycrystalline, or amorphous semiconductor, a semiconductor dielectric (e.g., a semiconductor oxide, semiconductor nitride, a semiconductor carbide, etc.), an insulator, and/or other suitable material.

Electron tunneling may cause current to flow between the two electrodes 604 and 606 when a voltage is applied despite the presence of the intermediate layers 608 and 610. The logarithm of the probability of an electron tunneling through the intermediate layers 608 and 610 is proportional to the integral of the square root of the barrier height of the intermediate layers 608 and 610 over the thickness of the layers. Furthermore, if a bias is applied across a plurality of layers having materials with different dielectric constants, the resulting electric field will be smaller in layers with a higher dielectric constant. Consequently, the tunneling current through the stack will increase faster as bias voltage rises for one polarity than the opposite polarity depending on the relative barrier heights and dielectric constants of the layers. Put more simply, the I-V response of the tunneling selector device 602 depends on properties of the intermediate layers 608 and 610 such as the respective barrier heights, the dielectric constants, and the effective tunneling masses.

By forming intermediate layers 608 and 610 to have different barrier heights, dielectric constants, and/or other electrical properties, a tunneling selector device 602 may be formed with an asymmetric I-V response. This asymmetric behavior may be used to achieve a reduction in sneak current given asymmetry in the number of cells per address line. For example, a sneak current associated driving any of the first set of address lines 102 (e.g., current direction 512) may be larger than a sneak current associated with driving any of the second set of address lines 106 (e.g., current direction 514) due to differences in the number of cells 112 coupled to the address lines or other causes. To reduce the larger sneak current, the tunneling selector device 602 may have a greater resistance when any of the first set of address lines 102 is driven than when any of the second set of address lines 106 is driven. To achieve this, intermediate layer 610 may be formed to have a higher dielectric constant and/or a higher barrier height than intermediate layer 608. As a result, resistance of the tunneling selector device 602 may be greater in current direction 512 than in current direction 514 for a given voltage magnitude, particularly at a voltage that occurs across an unselected cell 112.

While the above examples rely on Schottky barrier height and/or electron tunneling to produce asymmetric I-V behavior, in some examples, selector devices in a cell 112 use hole tunneling, trap-assisted tunneling, resonant tunneling, and/or other properties and phenomena to produce such a response.

Figure 7A:
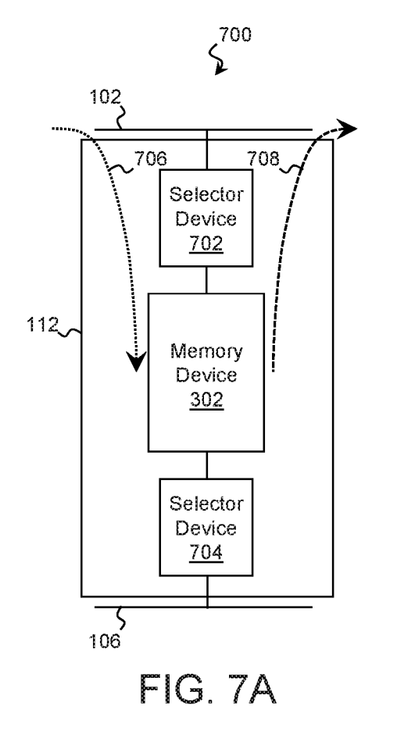
FIG. 7A is a circuit diagram of a crossbar circuit portion including a plurality of selector devices according to some examples of the present disclosure.
Figure 7B:
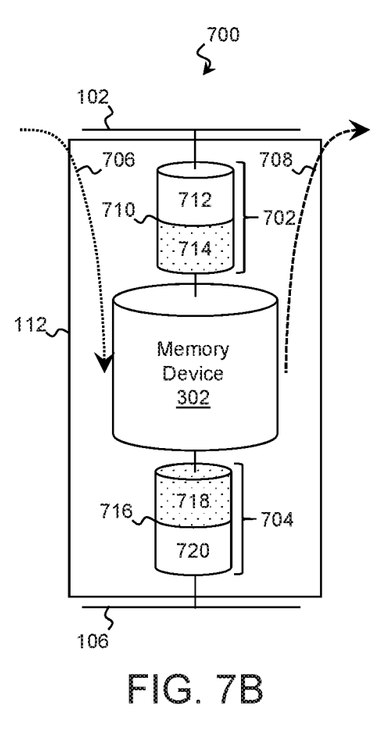
FIG. 7B is a diagram of a crossbar circuit portion including a plurality of selector devices according to some examples of the present disclosure.

In addition to or as an alternative to the selector device of FIGS. 3-6, a plurality of selector devices may be used to provide a symmetric or asymmetric I-V response. FIG. 7A is a circuit diagram of a crossbar circuit portion 700 including a plurality of selector devices according to some examples of the present disclosure. FIG. 7B is a diagram of the crossbar circuit portion 700 including the plurality of selector devices according to some examples of the present disclosure.

Referring first to FIG. 7A, the crossbar circuit portion 700 includes a cell 112 that may extend between and electrically couples to an address line 102 of a first type (e.g., a word line or a bit line) and an address line 106 of a second, complementary type (e.g., a bit line or a word line), each substantially similar to those of FIGS. 1-6.

The cell 112 includes a memory device 302, and to control sneak current through the memory device 302 when unselected, the cell 112 may include a first selector device 702 and a second selector device 704 in series with the memory device 302. In some examples, the first selector device 702 electrically couples the memory device 302 to the address line 102 of the first type and the second selector device 704 electrically couples the memory device 302 to the address line 106 of the second type.

The selector devices 702 and 704 may have a combined I-V response that is symmetrical or asymmetrical. Accordingly, in some examples, the combined resistances of selector devices 702 and 704 (at the selected voltage, the unselected voltage, or both) associated with current direction 706 may be higher or lower than the corresponding resistances associated with current direction 708. This electrical asymmetry may be used to reduce sneak current when the cell 112 is incorporated into a larger structure such as a crossbar.

In one such example, a sneak current associated with current direction 706 is greater than a sneak current associated with current direction 708 due to asymmetry in the address lines and/or other causes. To reduce the larger sneak current, the combined resistance of the selector devices 702 and 704 in the orientation that corresponds to the current direction 706 is configured to be relatively larger. To mitigate the impact on the read and write voltages of the cell 112, the combined resistance of the selector devices 702 and 704 in the orientation that corresponds to the current direction 708 is configured to be relatively smaller. The overall sneak current may be reduced even though the resistance in current direction 708 is not as high.

Referring to FIG. 7B, in some examples, the I-V responses are produced, in part, by conductor/insulator or conductor/semiconductor interfaces within the selector devices. In that regard, the first selector device 702 may include a first interface 710 between a first selector electrode 712 and a first intermediate portion 714. Similarly, the second selector device 704 may include a second interface 716 between a second intermediate portion 718 and a second selector electrode 720. Interface 710 may be associated with and predominantly affect the resistance in current direction 708, while interface 716 may be associated with and predominantly affect the resistance in current direction 706.

The first selector electrode 712 and the second selector electrode 720 may each include one or more layers of a conductive material such as titanium, tantalum, tungsten, ruthenium, platinum, other metals and alloys thereof, metal oxides, metal nitrides, metal carbides, and/or other conductive materials. The first intermediate portion 714 and the second intermediate portion 718 may each include any suitable material such as a semiconductor (e.g., a crystalline, polycrystalline, or amorphous semiconductor), a dielectric (e.g., a semiconductor oxide, semiconductor nitride, a semiconductor carbide, etc.), an insulator, a metal-silicon compound, and/or other suitable materials.

The first interface 710 and the second interface 716 may each define a separate and independent Schottky barrier with a nonlinear I-V response. In some examples, the first interface 710 and the second interface 716 are configured so that the respective interfaces have substantially the same Schottky barrier heights. As a result, the combined selector devices 702 and 704 may have a symmetric I-V response with substantially the same total resistance for a given voltage magnitude regardless of the voltage polarity. In the alternative, the selector devices 702 and 704 may have different Schottky barrier heights resulting in an asymmetric I-V response. This asymmetric behavior may be used to balance a reduction in sneak current against an increase in read and write voltage due to a larger voltage drop across the selector devices 702 and 704.

In some examples, a sneak current associated with current direction 706 is larger than a sneak current associated with current direction 708 due to line 102 being coupled to more cells 112 than line 106. To reduce the larger sneak current, the Schottky barrier height of interface 716, which corresponds to current direction 706, may be configured to be relatively larger. To mitigate the impact on the read and write voltages, the Schottky barrier height of interface 710, which corresponds to current direction 708, may be configured to be relatively smaller. For example, the first selector electrode 712 may include titanium nitride, the second selector electrode 720 may include ruthenium, and the first intermediate portion 714 and the second intermediate portion 718 may each include silicon.

Figure 8:
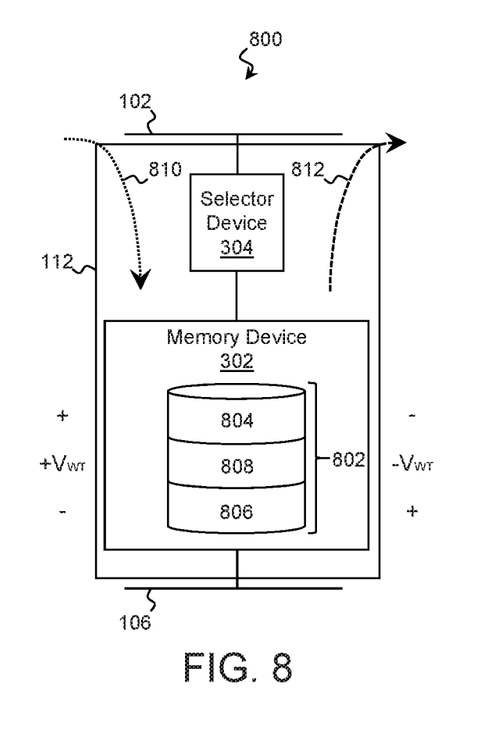
FIG. 8 is a circuit diagram of a crossbar circuit portion including a memory device according to some examples of the present disclosure.
Figure 9:
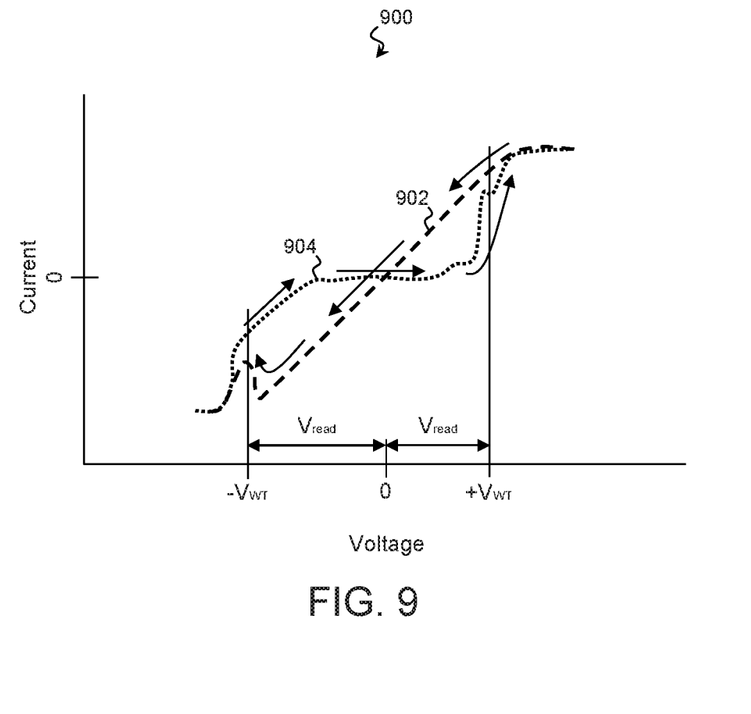
FIG. 9 is an I-V plot of current and voltage of a memory device according to some examples of the present disclosure.

Because the voltage drop across a selector device is directly proportional to its resistance, increasing the resistance of a selector device to reduce sneak current may decrease the voltage across the remainder of the cell. In a memory device example, this may affect the read and write voltages for the cell. This can be remedied by increasing the read voltage or the write voltage. Additionally or in the alternative, asymmetry in other components, such as the memory device 302 of the cell 112, may be leveraged to offset this effect as shown in FIGS. 8 and 9. FIG. 8 is a circuit diagram of a crossbar circuit portion 800 including a memory device according to some examples of the present disclosure. FIG. 9 is an I-V plot 900 of current and voltage of a memory device according to some examples of the present disclosure. The address lines 102 and 106, the cell 112, the selector device 304, and the memory device 302 may be substantially similar to those of FIGS. 1-7.

Referring first to FIG. 8, the memory device 302 of the cell 112 includes a memristive device 802 for storing data. In the illustrated examples, the memristive device 802 includes a first electrode 804 and a second electrode 806, each containing one or more layers of a conductive material such as titanium, tantalum, tungsten, ruthenium, platinum, other metals and alloys thereof, metal oxides, metal nitrides, metal carbides, and/or other conductive materials.

A memristive core 808 is disposed between the first electrode 804 and the second electrode 806. The memristive core 808 may include a metal compound such as a metal oxide, a metal nitride, and/or a metal carbide. Additionally or in the alternative, the memristive core 808 may include a semiconductor compound such as a crystalline, polycrystalline, or amorphous semiconductor, a semiconductor oxide, semiconductor nitride, a semiconductor carbide, a metal-silicon compound, and/or other suitable semiconductor compound. The memristive core 808 may be formed to any suitable thickness, and in some examples, has a thickness between about 10 nm and about 100 nm.

The memristive device 802 may have more than one electrical state, such as a high impedance state and a low impedance state, and data may be encoded in the different states. FIG. 9 illustrates a voltage and current relationship of a memristive device 802 according to some examples. When a read voltage is applied to the memristive device 802, the current through the device depends on the resistive state. As can be seen, the memristive device 802 has a first I-V segment 902 corresponding to a low resistive state and a second I-V segment 904 corresponding to a high resistive state.

The resistive state may be changed by applying a relatively higher voltage that exceeds a write threshold ($\pm V_{WT}$) to the memristive device 802. This may cause the device 802 to transition states (e.g., from the low-resistive state to the high-resistive state or vice-versa). In some examples, the final state of the memristive device 802 depends on the polarity of the voltage. For example, a positive write voltage may cause the device to be in the high-resistive state, and a negative write voltage may causes the device to be in the low-resistive state. These may be referred to as set and reset operations and the write threshold voltages may be referred to as set and reset voltages depending on the associated state of the memristive device 802.

The positive write threshold (+VWT) and the negative write threshold (−VWT) may be different in magnitude, and thus the memristive device 802 may be asymmetrical in this regard. Referring back to FIG. 8, this asymmetry may be used to mitigate the effect of the selector device's 307 asymmetry on the write voltage for the cell 112. To explain in more detail, for a given voltage magnitude, an asymmetric selector device 304 has an increased resistance, increased voltage drop, and reduced current in a first voltage polarity and current direction (e.g., first current direction 810) than in a second voltage polarity and current direction (e.g., second current direction 812). This selector device 304 asymmetry may be purposeful to compensate for effects of some address lines being electrically coupled to more cells than others and/or other conditions.

However, the larger voltage drop across the selector device 304 may reduce the voltage across the memristive device 802 and thus increase the read and write voltage associated with the cell 112 as a whole. To address this, in some examples, the memristive device 802 is electrically oriented so that the smaller write threshold voltage (of the set and reset voltages) corresponds to the voltage polarity and corresponding current direction in which the asymmetric selector device 304 has an increased resistance, increased voltage drop, and reduced current (e.g., first current direction 810). The relatively lower write threshold of the memristive device 802 reduces the effect of the relatively higher voltage drop across the selector device 304 so that the write thresholds for the cell 112 as a whole are more symmetrical.

Figure 10:
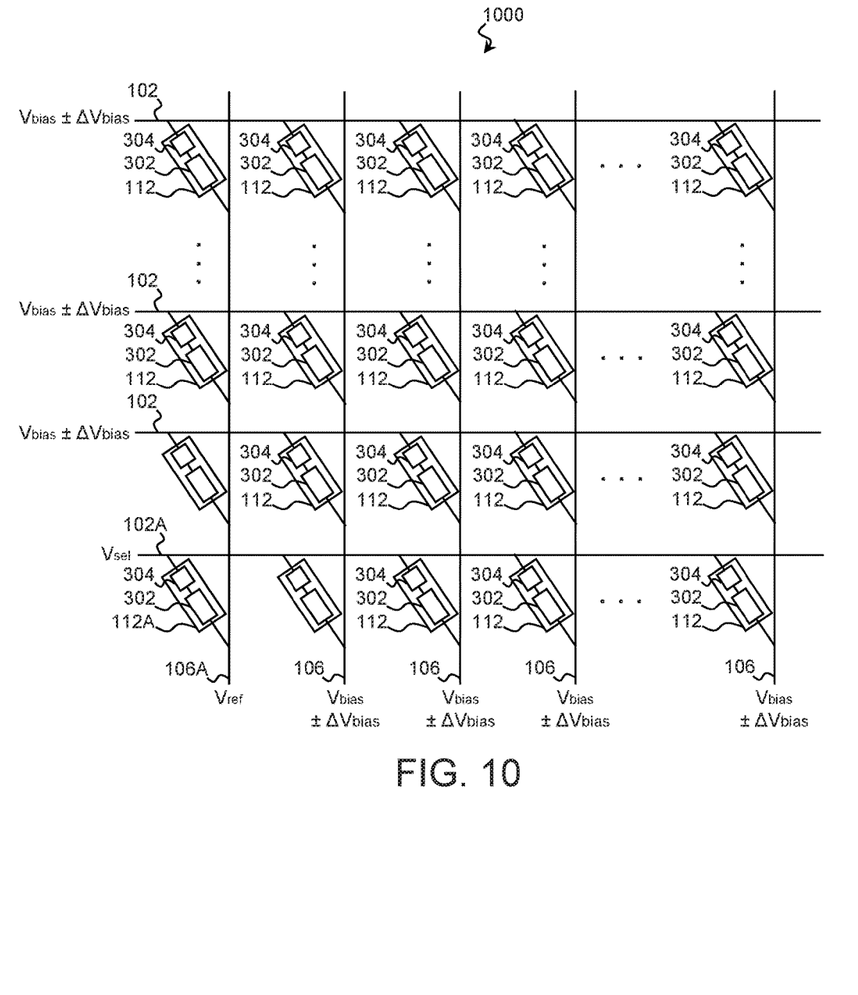
FIG. 10 is a circuit diagram of a crossbar circuit according to some examples of the present disclosure.

In addition to or as an alternative to the memristive devices' asymmetry, an asymmetrical bias may be applied to unselected address lines to compensate for the asymmetry in the selector device 304 and to control sneak current. FIG. 10 is a circuit diagram of a crossbar circuit 1000 according to some examples of the present disclosure. The crossbar circuit 1000 may be substantially similar to that of FIGS. 1, 2, and 4, and may include a first set of address lines 102 and a second set of address lines 106 with cells 112 disposed between and electrically coupled to the lines substantially as described above.

An individual cell 112A may be selected by applying a select voltage between a line (e.g., line 102A) of the first set of address lines 102 and a line (e.g., line 106A) of the second set of address lines 106. In FIG. 10, this select voltage is indicated by $V_{sel}$ and $V_{ref}$ on the respective address lines. The select voltage may correspond to a read or write voltage of the selected cell 112A. A bias voltage ($V_{bias}$) may be applied to the remaining, unselected lines of both the first set of address lines 102 and the second set of address lines 106. The magnitude of the bias voltage may be less than the select voltage, and in some examples, the bias voltage is substantially half the select voltage. For example, the unselected address lines may be grounded, while half of the select voltage ($V_{sel}/2$) is applied to line 102A and half of the select voltage is applied to line 106A in the opposite polarity ($-V_{sel}/2$).

The bias voltage may be symmetrical and equal in magnitude regardless of the polarity of the select voltage and the associated current direction. However, in some applications, a symmetrical bias voltage may counteract the benefits of an asymmetrical selector device 304 and/or memory device 302 by producing different electric fields the selector devices 304 of in a particular type of unselected cells 112 depending on the current direction. In some examples, a symmetrical bias voltage produces different field strengths in half-selected cells 112, those electrically coupled to one selected address line and one unselected address line, that contain a memory device 302 with an asymmetrical I-V response. The voltage polarity and current direction with lower current due to the memory device 302 may set the memory device 302 and the selector device 304 operating against each other. The low current drives down the voltage drop across the memory device 302 and, because the select voltage is constant, drives the voltage across the selector device 304 up. The increased voltage across the selector device 304 drives the current back up.

To address this, different bias voltages may be used for different voltage polarities and current directions. The bias voltage delta ($\Delta V_{bias}$) may be determined by iterative analysis or any other suitable technique. In some examples, the bias voltage delta is selected so that the total bias voltage ($V_{bias} \pm \Delta V_{bias}$) produces substantially equal (and opposite) electrical fields across the selector device 304 in each current direction. In other words, the bias voltages are selected to produce substantially equal (and opposite) voltage drops across the selector device 304 in each current direction. Thus, the total bias voltage can be determined from the I-V behavior of the selector device 304 and the remainder of the cell 112 (e.g., the memory device 302).

In that regard, the voltage across the selector device 304 in a given current orientation is a factor of the total voltage applied and the voltage drop across the memory device 302. In turn, the voltage drop across the memory device 302 is a factor of the resistance of the memory device 302 in the current orientation. This resistance depends in part on the state (high resistance or low resistance) of the memory device 302, and it may be assumed that equal numbers of memory devices 302 will be in each state. The resistance of the high resistance state may be significantly higher than the low resistance state, and thus, the average resistance of a memory device 302 may be estimated to be about half of the high resistance state value. From the average resistance of the memory devices 302, current and selector device 304 voltage can be determined, leading to a bias voltage differential used to produce the substantially equal and opposite electrical fields across the selector device 304 in each current direction.

By equalizing the electric fields, the asymmetrical the bias voltage differential may increase the resistance of the selector device 304 in the half selected cells 112 in order to better the control sneak current.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A circuit comprising:
   a first address line;
   a selector device electrically coupled to the first address line, wherein the selector device has a first I-V response in a first current direction and a second I-V device in a second current direction that is different from the first I-V response; and
   a first memory device electrically coupled between the selector device and a second address line, wherein the first I-V response of the selector device substantially prevents a current from passing through the first memory device when a second memory device coupled to the first address line is selected, and wherein the second I-V response of the selector device substantially prevents a current from passing through the first memory device when a third memory device coupled to the second address line is selected.

2. The circuit of claim 1,
wherein the first address line is electrically coupled to a first total count of memory devices,
wherein the second address line is electrically coupled to a second total count of memory devices, and
wherein the first total count being greater than the second total count.

3. The circuit of claim 2, wherein the first I-V response of the selector device is associated with driving the first address line and has a greater resistance at a voltage magnitude than the second I-V response of the selector device based on the first total count being greater than the second total count.

4. The circuit of claim 1, wherein the selector device includes:
a first electrode electrically coupled to the first address line;
an intermediate portion electrically coupled to the first electrode, wherein the intermediate portion includes a material selected from a group consisting of a semiconductor, a dielectric, and an insulator; and
a second electrode electrically coupled to the intermediate portion and to the memory device.

5. The circuit of claim 4,
wherein the first address line is a word line,
wherein the second address line is a bit line, and
wherein a first Schottky barrier height of the first electrode and the intermediate portion is greater than a second Schottky barrier height of the second electrode and the intermediate portion.

6. The circuit of claim 1, wherein the selector device is an asymmetrical tunneling device that includes:
a first electrode electrically coupled to the first address line;
a first intermediate portion electrically coupled to the first electrode;
a second intermediate portion electrically coupled to the first intermediate portion, wherein the second intermediate portion is different from the first intermediate portion in a property selected from a group consisting of a barrier height and a dielectric constant; and
a second electrode electrically coupled between the second intermediate portion and the memory device.

7. The circuit of claim 1,
wherein the first current direction is associated with a first operation from a set consisting of a set operation and a reset operation,
wherein the second current direction is associated with a second operation from the set consisting of the set operation and the reset operation, and
wherein a programming voltage of the first memory device associated with the first operation is less than a programming voltage of the first memory device associated with the second operation.

8. The circuit of claim 1, wherein the circuit comprises a first inactive address line of a same type as the first address line and a second inactive address line of a same type as the second address line,
wherein the first current direction is associated with a first operation from a set consisting of a set operation and a reset operation,
wherein the second current direction is associated with a second operation from the set consisting of the set operation and the reset operation, and
wherein the circuit is to apply a first bias voltage to the first inactive address line and to the second inactive address line during the first operation that is different from a second bias voltage to be applied to the first inactive address line and to the second inactive address line during the second operation.

9. A circuit comprising:
a first address line;
a first selector device electrically coupled to the first address line,
a first memory device electrically coupled to the first selector device;
a second selector device electrically coupled to the memory device, wherein the first selector device and the second selector device have a first I-V response in a first current direction and a second I-V response in a second current direction, and wherein the second I-V response is different from the first I-V response; and
a second address line electrically coupled to the second selector device, wherein the first I-V response substantially prevents a current from passing through the first memory device when a second memory device coupled to the first address line is selected, and wherein the second I-V response substantially prevents a current from passing through the first memory device when a third memory device coupled to the second address line is selected.

10. The circuit of claim 9,
wherein the first address line is electrically coupled to a first total count of memory devices;
wherein the second address line is electrically coupled to a second total count of memory devices, and
wherein the first total count is greater than the second total count.

11. The circuit of claim 10, wherein the first I-V response is associated with driving the first address line and has a higher resistance at a voltage magnitude than the second I-V response based on the first total count being greater than the second total count.

12. The circuit of claim 9, wherein the first selector device includes:
a first electrode electrically coupled to the first address line; and
a first intermediate portion electrically coupled to the first electrode, wherein the first intermediate portion includes a first material selected from a group consisting of a semiconductor, a dielectric, and an insulator, and wherein the first electrode and the first intermediate portion have a first Schottky barrier height;
wherein the second selector device includes:
a second intermediate portion electrically coupled to the first memory device; and
a second electrode electrically coupled to the second intermediate portion, wherein the second intermediate portion includes a second material selected from the group consisting of the semiconductor, the dielectric, and the insulator, and wherein the second electrode and the second intermediate portion have a second Schottky barrier height that is different from the first Schottky barrier height.

13. The circuit of claim 9, wherein the first current direction is associated with a first operation from a set consisting of a set operation and a reset operation,
wherein the second current direction is associated with a second operation from the set consisting of the set operation and the reset operation, and
wherein a programming voltage of the first memory device associated with the first operation is less than a programming voltage of the first memory device associated with the second operation.

14. The circuit of claim 9,
wherein the first current direction is associated with a first operation from a set consisting of a set operation and a reset operation,
wherein the second current direction is associated with a second operation from the set consisting of the set operation and the reset operation, and
wherein the circuit is to apply a first bias voltage during the first operation that is different from a second bias voltage to be applied during the second operation.

15. An integrated circuit comprising:
a first address line electrically coupled to a first plurality of cells; and
a second address line electrically coupled to a second plurality of cells, wherein the first address line is electrically coupled to a greater total number of cells than the second address line, and wherein each cell has a selector device with a first I-V response in a first current direction and a second I-V response in a second current direction that is different from the first I-V response, wherein the first I-V response of each selector device substantially prevents a current from passing through each cell when another cell coupled to the first address line is selected, and wherein the second I-V response of each selector device substantially prevents a current from passing through each cell when another cell coupled to the second address line is selected.

16. The integrated circuit of claim 15, wherein the first I-V response is associated with driving the first address line and has a higher resistance at a voltage magnitude than the second I-V response.

17. The integrated circuit of claim 15, wherein the selector device has a first Schottky barrier height in the first current direction that is greater than a second Schottky barrier height of the selector device in the second current direction.

18. The integrated circuit of claim 15, wherein the selector device includes:

a first electrode electrically coupled to the first address line;
a first intermediate portion electrically coupled to the first electrode;
a second intermediate portion electrically coupled to the first intermediate portion, wherein the second intermediate portion is different from the first intermediate portion in a property selected from a group consisting of a barrier height and a dielectric constant; and
a second electrode electrically coupled between the second intermediate portion and a memory device of the cell.

19. The integrated circuit of claim 15,
wherein the first current direction is associated with a first operation from a set consisting of a set operation and a reset operation,
wherein the second current direction is associated with a second operation from the set consisting of the set operation and the reset operation, and
wherein each element of the first plurality of cells and of the second plurality of cells includes a memory device having a programming voltage associated with the first operation that is less than a programming voltage associated with the second operation.

20. The integrated circuit of claim 15,
wherein the first current direction is associated with a first operation from a set consisting of a set operation and a reset operation,
wherein the second current direction is associated with a second operation from the set consisting of the set operation and the reset operation, and
wherein the circuit is to apply a first bias voltage during the first operation is that is different from a second bias voltage to be applied during the second operation.

* * * * *